United States Patent [19]
Sakaue

[11] Patent Number: 5,406,112
[45] Date of Patent: Apr. 11, 1995

[54] SEMICONDUCTOR DEVICE HAVING A BURIED WELL AND A CRYSTAL LAYER WITH SIMILAR IMPURITY CONCENTRATION

[75] Inventor: Hisashi Sakaue, Kyoto, Japan

[73] Assignee: Rohm, Co., Ltd., Kyoto, Japan

[21] Appl. No.: 299,661

[22] Filed: Sep. 2, 1994

Related U.S. Application Data

[63] Continuation of Ser. No. 100,351, Aug. 2, 1993, abandoned, which is a continuation of Ser. No. 925,051, Aug. 5, 1992, abandoned.

Foreign Application Priority Data

Oct. 4, 1991 [JP]  Japan ................................. 3-257732

[51] Int. Cl.$^6$ ............................................. H01L 29/72
[52] U.S. Cl. .................................. 257/558; 257/552; 257/565
[58] Field of Search ............... 257/557, 558, 559, 566, 257/585, 586, 552, 565

[56] References Cited

U.S. PATENT DOCUMENTS 3,573,573  4/1971  Moore ................................. 257/566
5,065,214  11/1991  Lapham et al. .................... 257/565

FOREIGN PATENT DOCUMENTS 58-6168   1/1983  Japan ................................. 257/552
2-266530  10/1990  Japan ................................. 257/557

Primary Examiner—Ngan V. Ngo
Attorney, Agent, or Firm—Nikaido, Marmelstein, Murray & Oram

[57] ABSTRACT

A method for producing a semiconductor device includes a step of patterning a surface of a semiconductor substrate of first conductivity-type, a step of injecting impurity ion of second conductivity-type, a step of forming a buried well by subjecting the injected substrate to a thermal treatment, a step of forming a semiconductor crystal layer of the second conductivity-type on the substate surface, and a step of forming semiconductor elements. A semiconductor device and a longitudinal transistor produced by the method are also disclosed. In the method, after the step of forming the semiconductor crystal layer, the impurity concentration of the buried well is controlled to be nearly the same as that of the semiconductor crystal layer. According to the present invention, a semiconductor crystal layer of reverse conductivity-type to that of the substrate can be formed on the substrate in different thickness at different regions.

1 Claim, 5 Drawing Sheets

SEMICONDUCTOR DEVICE HAVING A BURIED WELL AND A CRYSTAL LAYER WITH SIMILAR IMPURITY CONCENTRATION

This application is a continuation of application Ser. No. 08/100,351, filed Aug. 2, 1993, now abandoned, which is a continuation of application Ser. No. 07/925,051, filed Aug. 5, 1992, now abandoned.

FIELD OF THE INVENTION

The present invention relates to a semiconductor device and a method for producing the semiconductor device. In the present invention a buried well is formed on the surface of a semiconductor substrate, and a semiconductor crystal layer is further formed thereon by epitaxial growth. More particularly, in the present invention, the buried well is formed so as to have nearly the same concentration as that of the epitaxial growth layer.

BACKGROUND OF THE INVENTION

When producing a semiconductor device, there have been many cases wherein semiconductor crystal layers of different conductivity-type are formed on a semiconductor substrate to form a circuit. In some cases, a buried layer or other conductivity-type region is arranged at interface therebetween. For example in a case wherein a longitudinal p-n-p transistor is formed to a p-type semiconductor substrate, a buried layer is formed in order to prevent collector current from flowing toward the substrate.

FIG. 9 shows a cross sectional explanatory view of a semiconductor wherein a p-n-p transistor is formed on a p-type semiconductor substrate. In FIG. 9, numeral 1 represents a p-type semiconductor substrate, numeral 2 represents a n+-type buried layer, numeral 3 represents a semiconductor crystal layer, numeral 4 represents a p+-type collector region, numeral 5 represents a p+-type region, and numeral 6 is an isolation for insulating between the elements. When the layer 3 is formed by epitaxial growth, an impurity region formed on the surface of the substrate 1 is diffused into the layer 3 to form the n+- type buried layer 2. After the buried layer 2 is formed, p-type impurity is injected into the impurity region. This p-type impurity is diffused, when the layer 3 is formed, to form the p+-type collector region 4. The p+-type collector region 4 is connected to a collector electrode C via the p+-type region 5. Symbols E and B represent an emitter electrode and a base electrode respectively. The buried layer 2 is intended for preventing collector current from flowing toward the substrate.

For forming a p+-type layer on a n+-type buried layer, another method with two-stage epitaxial growth is also employed. This method is explained with reference to FIG. 10. A first layer of n-type epitaxial growth layer 7 is formed on a p-type semiconductor substrate 1, As + or the like is injected thereinto, and it is diffused to form a buried layer 2. A second layer of n-type epitaxial growth layer 8 is formed, then acceptor impurity such as B+ or the like is injected thereinto, and it is diffused to form a p+- region.

In a conventional case wherein semiconductor crystal layers of different conductivity-type are thickly formed on a semiconductor substrate, diffusion of isolation for insulating between elements is deepened and spread laterally to occupy a large area. On the contrary of this problem, there exists a requirement for forming on the substrate semiconductor crystal layers of reverse conductivity-type to that of the substrate in different thickness at different regions.

When forming the buried layer in the conventional longitudinal transistor, a n+(or p+)-type buried layer having a high impurity concentration is formed in order to prevent collector current from flowing toward the substrate. However there was a problem that low resistance can not be realized because width of p+-region is narrowed in the following step wherein auto doping easily happens. Besides, because on the n+-region, n+ impurity is much introduced into the p+-region, PN junction of high concentration can not be realized, and because the p+-region is narrowed, it is impossible to increase a withstand voltage of the p+-region and the n+-region.

In the case of the two-stage epitaxial growth, a junction of high concentration can be realized on the n+-region. However, because epitaxial growth must be twice performed, producing cost rises.

SUMMARY OF THE INVENTION

In view of the above-mentioned problems, an object of the present invention is to provide a method, wherein the above-mentioned problems are overcome, for forming on a semiconductor substrate a semiconductor crystal layer of reverse conductivity-type to that of the substrate.

Another object of the present invention is to provide a longitudinal transistor, wherein the above-mentioned problems are overcome, to which the method of the present invention is applied.

According to the present invention, there is provided a method for producing a semiconductor device comprising:

a step of patterning a surface of a semiconductor substrate of first conductivity-type, a step of injecting impurity ion of second conductivity-type by ion implantation through an opening formed by the patterning, a step of forming a buried well, which is a region formed by diffusion of the impurity, by subjecting the injected substrate to a thermal treatment, a step of forming a semiconductor crystal layer of the second conductivity-type on the substrate surface by epitaxial growth, and a step of forming semiconductor elements on the semiconductor crystal layer of the second conductivity-type wherein after the step of forming the semiconductor crystal layer by epitaxial growth, the impurity concentration of the buried well is controlled so as to be nearly the same as that of the semiconductor crystal layer formed by epitaxial growth.

According to the present invention, there is also provided a semiconductor device comprising:

a semiconductor substrate of first conductivity-type, a buried well of second conductivity-type formed on the semiconductor substrate of first conductivity-type, a semiconductor crystal layer of the second conductivity-type formed on the substrate of the first conductivity-type by epitaxial growth, and semiconductor elements formed on the semiconductor crystal layer wherein impurity concentrations of the buried well and the semiconductor crystal layer are nearly the same to each other.

In a semiconductor device of the present invention, it is also preferable that after the buried well is formed, an impurity region of the first conductivity-type is formed at a position, on the semiconductor substrate, where an isolation is to be formed, and an impurity region for a lower isolation of the semiconductor crystal layer is formed by diffusion from the impurity region of the first conductivity-type.

According to the present invention, there is further provided a longitudinal transistor comprising:
 a semiconductor substrate of first conductivity-type,
 a buried well of second conductivity-type formed on a surface of the semiconductor substrate,
 a first region for a collector or an emitter of the first conductivity-type, the first region being formed on the buried well,
 a base region of the second conductivity-type formed on the first region by epitaxial growth, and
 a second region of the first conductivity-type formed on the base region
wherein impurity concentration of the layer formed by epitaxial growth is nearly the same as that of the buried well.

According to the present invention, because a buried well is formed on a surface of a semiconductor substrate and thereon a semiconductor crystal layer is formed by epitaxial growth, a lower isolation of the same conductivity-type as that of the substrate can be formed at an isolation region, and the semiconductor crystal layer at this region can be formed thin. For this reason, the formation of the isolation can be realized with shallow diffusion and this prevents a lateral spread of this region. In the region, therebetween, because the buried well and the epitaxial growth layer are so made as to have nearly the same concentration to each other, the semiconductor substrate can be formed thickly and a withstand voltage thereof is increased.

In a longitudinal transistor using the buried well in the present invention, the concentration of the buried well is as low as that of the epitaxial growth layer. Due to this, a collector region is not compressed by the buried layer of high concentration, and a wide and highly concentrated collector region is realized, whereby the resistance of it is lowered. Thus, there is obtained a longitudinal transistor of high amplification factor, small power consumption, and high withstand voltage of the collector.

DETAILED DESCRIPTION OF THE PREFERRED EMBODIMENT

The present invention is explained below with reference to drawings. FIGS. 1 to 5 respectively show each step of a method of the present invention for producing a semiconductor substrate.

Figure 1:
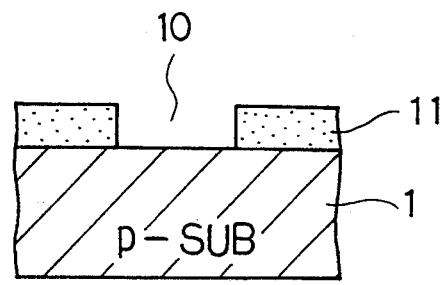
FIGS. 1 to 5 are respectively a cross sectional explanatory view showing each step of a method of the present invention.

As shown in FIG. 1, the surface of a semiconductor substrate 1 is patterned to form an opening 10. Specifically, thermal treatment by oxidation at about 1100° C. for about 120 minutes is performed to form $SiO_2$ film 11, and thereafter a photoresist is applied and partially removed by etching to form the opening 10.

Figure 2:
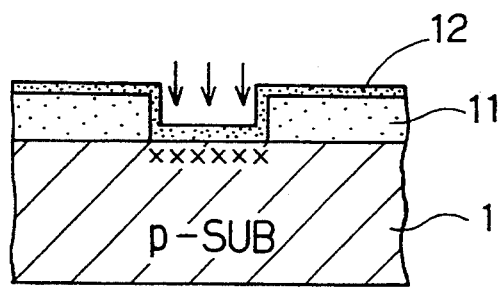

Next, as shown in FIG. 2, impurity of a conductivity-type different from that of the substrate 1 is injected into the substrate 1 by ion implantation. Specifically, over the substrate surface, PAD $SiO_2$ film 12 with 1000 Å thickness is formed by thermal treatment, and thereafter ions of $P^+$ or $As^+$ are injected into the $p^+$-type semiconductor substrate by ion implantation with a dose of $10^{14} cm^{-2}$. This PAD $SiO_2$ film 12 is intended for protecting the substrate surface and for preventing crystal defect or the like during the ion implantation and during the following thermal treatment.

Figure 3:
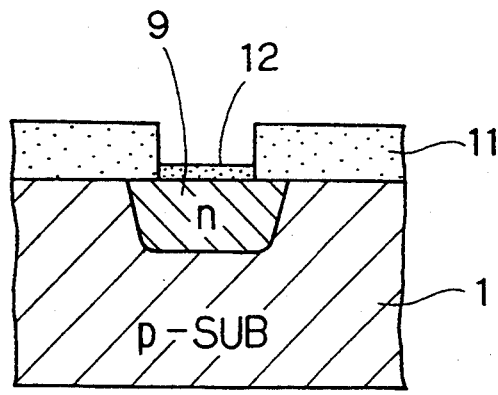

Then, as shown in FIG. 3, the impurity is diffused by thermal treatment to form a buried well 9. Specifically, thermal treatment at about 1230° C. for about 1200 minutes is performed. By this treatment, ions injected by ion implantation are well diffused and activated.

Figure 6:
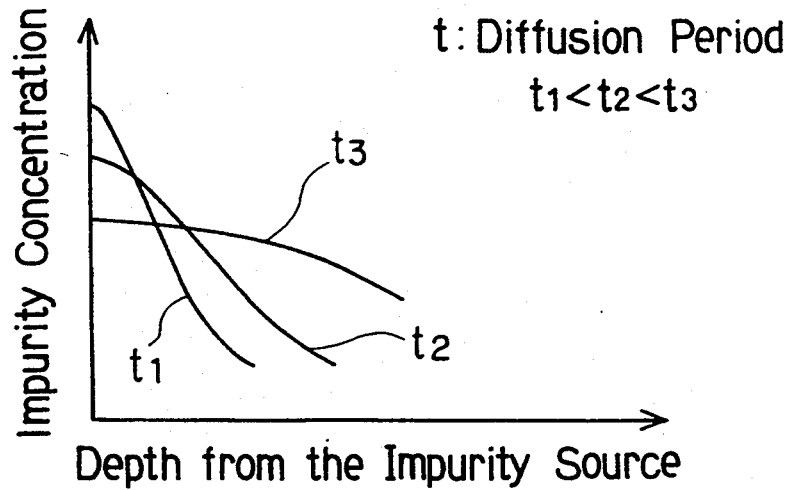
FIG. 6 is a graph showing distribution of diffused impurity over a substrate.

In FIG. 6, the relationship between depth from impurity source and impurity concentration is shown for different periods of thermal treatment in a form of a graph. As shown in this graph, lengthening of the diffusion period (t3 in FIG. 6) brings an uniform impurity concentration over a deep range, and shortening of the diffusion period (t1 in FIG. 6) brings a distribution of impurity concentration that is high at a vicinity of the source and becomes sharply low as the depth increases. Thus, depending on the depth from the impurity source and diffusion period, a flat distribution of impurity concentration is realized. This flat distribution restrains the impurity from entering the $P^+$ region during the following epitaxial growth. Also, controlling the dose of impurity by ion implantation makes it possible to control impurity concentration. Thus, controlling of the distribution and the grade of impurity makes it possible to flexibly control concentration of the buried well.

Figure 4:
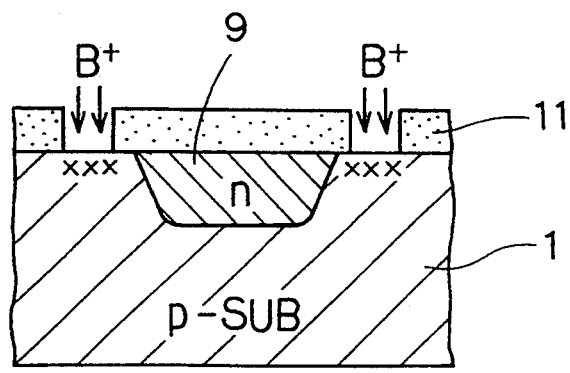
Figure 5:
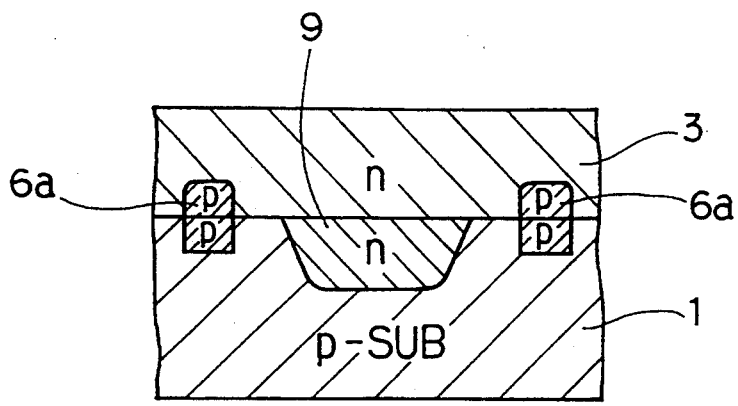

As shown in FIG. 4, ions are injected into a position where isolation is to be formed. Thereafter, the protective film on the substrate surface is removed and a semiconductor crystal layer is formed by epitaxial growth (refer to FIG. 5). Specifically, $SiO_2$ film 11 is partially removed by etching and boron ions $B^+$ are injected by ion implantation with a dose of $10^{14} cm^{-2}$, and thereafter the $SiO_2$ film 11 is completely removed by corrosion with liquid fluorine. In a furnace for epitaxial growth into which gaseous dichlorosilane is introduced, the substrate is subjected to gas phase reaction at about 1100° C. so that n-type silicone is formed by epitaxial growth as a semiconductor crystal layer 3 of about 5 μm in thickness. During this epitaxial growth, depending on the temperature, the injected $B^+$ is diffused not only into the substrate 1 but also into the semiconductor layer 3 to form a lower isolation region 6a.

As explained above, the impurity concentration of the buried well 9 after epitaxial growth depends on the period of thermal treatment and the concentration of injected impurity. Considering this, by controlling the dose of injection, the buried well 9 can be formed so as to have nearly the same impurity concentration as that of the semiconductor growth layer 3 which is formed by epitaxial growth. It should be noted that though the expression "nearly the same" is employed here, actually it does not matter if there is one order difference between the concentrations.

The semiconductor layer 3 of second conductive-type is formed on the substrate 1 in the condition as stated above. The n-type semiconductor crystal layer 3 is formed thin on the lower isolation region 6a and formed thick between the isolation regions.

Figure 7:
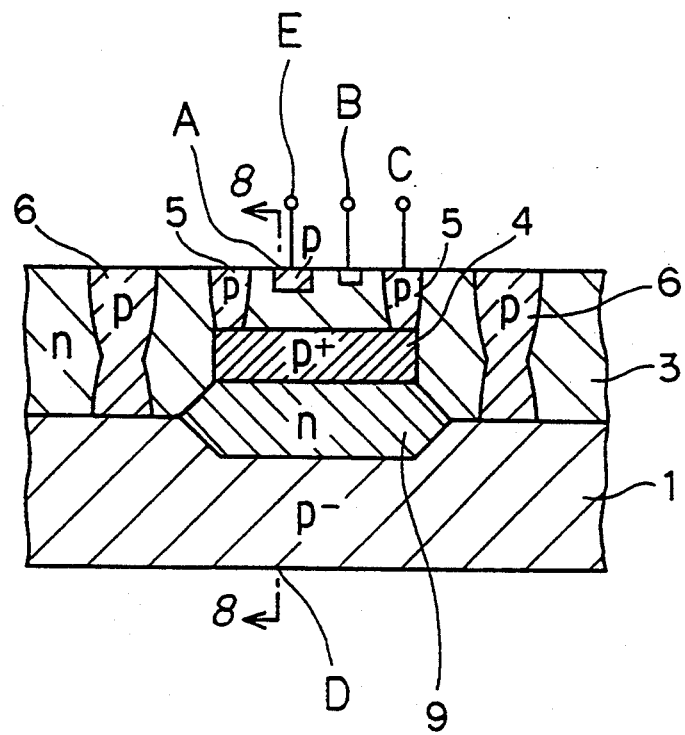
FIG. 7 is a cross sectional explanatory view of a longitudinal transistor of the present invention.
Figure 9:
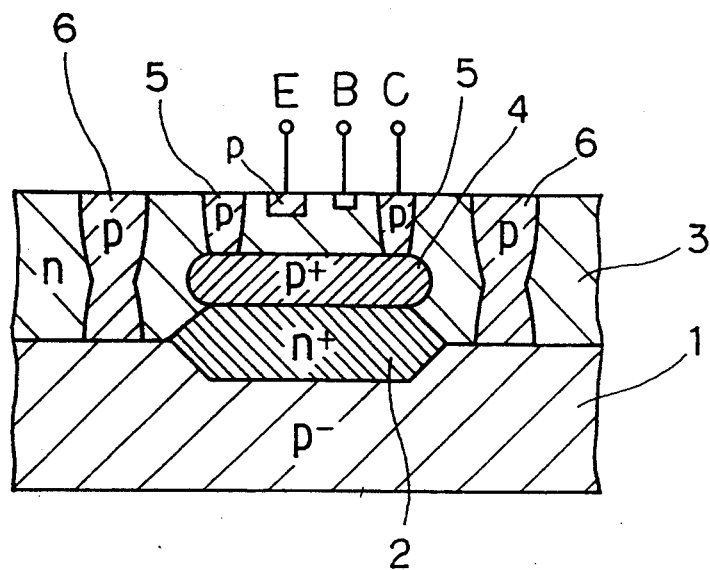
FIG. 9 is a cross sectional explanatory view of a conventional longitudinal transistor.
Figure 10:
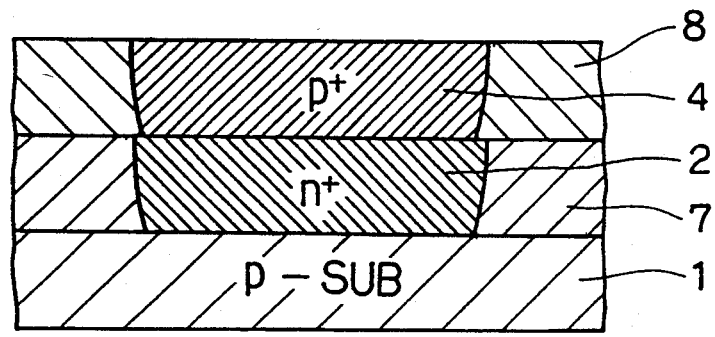
FIG. 10 is a cross sectional explanatory view of a buried layer formed by conventional two-stage epitaxial growth.

Hereinafter, an embodiment of a longitudinal transistor employing the substrate is explained below. FIG. 7 is a cross sectional explanatory view of a semiconductor wherein a longitudinal p-n-p transistor is formed according to the present invention. In FIG. 7, numerals 1 to 6 represent the same elements as in FIG. 9. Numeral 9 represents a buried well which is formed so as to have nearly the same impurity concentration, of $10^{16}$ to $10^{17}$ $cm^{-3}$, as that of the n-type epitaxial growth layer 3. Though a conventional buried well is formed at a region where impurity concentration is high, in the present invention the buried well 9 is formed so as to have nearly the same impurity concentration as that of epitaxial growth layer of low concentration, and thereon a $p^+$-type region is formed to constitute the collector region 4 of the longitudinal transistor. Due to this constitution, introduction of impurity from the buried well 9 to the collector region 4 is hard to happen, whereby the collector region is not compressed and narrowed. This realizes a low resistance (reduced by 40% compared with conventional one).

Figure 8:
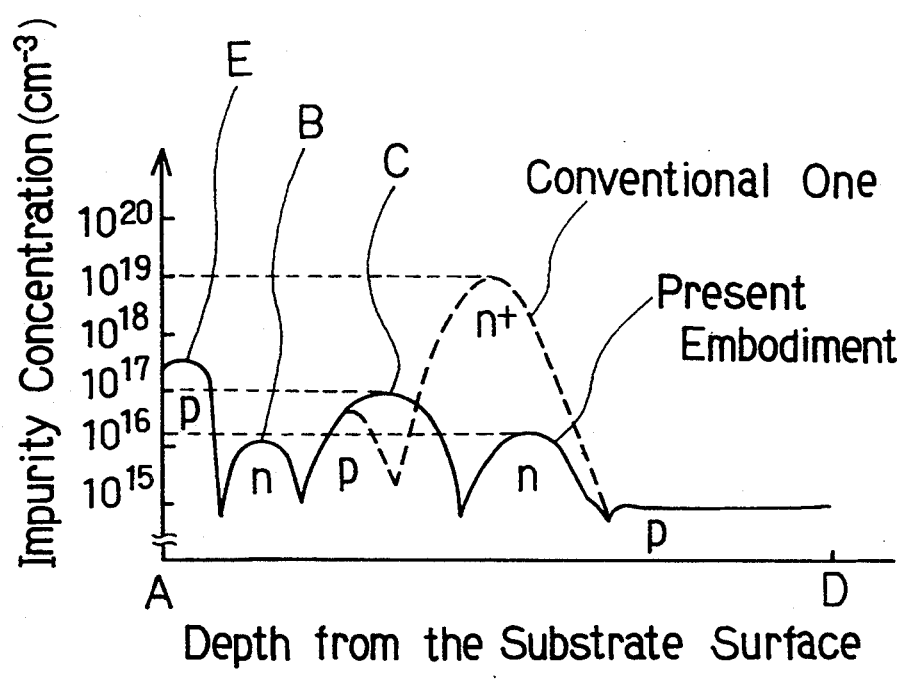
FIG. 8 is a graph showing distribution of diffused impurity over a substrate on which a longitudinal transistor of the present invention is formed.

FIG. 8 shows relationship between concentrations of the buried well 9 and the collector region 4, with comparing with a conventional relationship. In FIG. 8, axis of abscissas indicates a depth from the substrate surface (point A in FIG. 7) toward the reverse surface (point D in FIG. 7) on a plane cut along a line 8—8, and axis of ordinates indicates impurity concentration ($cm^{-3}$). In FIG. 8, distribution of impurity concentration concerning the present embodiment is shown by full line, and the conventional one is shown by a dotted line. As is clear from FIG. 8, in the present invention, because the concentration of the buried well 9 is nearly the same as that of the epitaxial growth layer 3, the p-type collector region is not narrowed at all, so that concentration of the region 4 can be kept at a high level and its resistance can be lowered. On the other hand, referring to the dotted line in FIG. 8 which indicates the distribution of the impurity concentration of the conventional buried layer 2, it is found that the dotted line shows a peak, where the concentration is $10^{19} cm^{-3}$, at the $n^+$-type buried layer 2, and that impurity in the layer 2 is diffused into the collector region 4 due to the high concentration, so that the collector 4 is compressed to be narrowed and the p-type concentration thereof is lowered.

Hereinafter, a method of an embodiment of the present invention for producing a longitudinal transistor is explained.

A buried well 9 is formed with the same steps as shown in FIGS. 1 to 3. In the step in FIG. 4, during ion implantation to a position where isolation is to be formed, an opening is also formed in the film 11 existing on the buried well 9 and $B^+$ ions are injected by ion implantation also into the surface of the buried well 9 through the opening. Thereafter, under the same condition in the step in FIG. 5, epitaxial growth is performed, whereby collector region 4 is formed in the same manner as in the formation of the lower isolation region 6a.

Thereafter, a p-type region 5 contacting with the collector region 4, p-type emitter region and isolation 6 are formed on the resulting epitaxial growth layer 3, whereby the transistor shown in FIG. 7 is realized.

As stated above, according to the present invention, when a semiconductor crystal layer of a different conductivity-type from that of a semiconductor substrate is formed on the substrate, concentrations of the layer and the substrate are controlled to be nearly the same level by using both diffusion and epitaxial growth. Due to this, a semiconductor crystal layer of reverse conductivity-type to that of the substrate can be formed on the substrate in different thickness at different regions.

As a result, at the isolation region, the isolation can be formed with shallow diffusion, and lateral spread of it can be prevented. On the other hand, at a region where a circuit is to be formed, a deep semiconductor crystal layer can be obtained and arrangement of longitudinal elements can also be realized.

In an application of a method of the present invention, as an alternative to a buried layer in a conventional longitudinal transistor, the above-mentioned buried well is formed on a semiconductor substrate to constitute a longitudinal transistor. Due to this, the conventional problem that the collector region is compressed to be narrowed and its resistance increases can be overcome, and performance of a transistor such as high amplification factor and reduced power consumption can be greatly improved.

Though several embodiments of the present invention are described above, it is to be understood that the present invention is not limited only to the above-mentioned, various changes and modifications may be made in the invention without departing from the spirit and scope thereof.

What is claimed is:

1. A transistor formed on a semiconductor substrate, comprising:
    a semiconductor substrate of a first conductivity-type;
    a buried well of second conductivity-type, the buried well including an impurity doped region and being formed on a surface of the semiconductor substrate;
    a first region of the first conductivity-type for one of a collector and an emitter, the first region being an impurity doped buried region formed on the buried well;
    a base region of the second conductivity-type formed on the first region by epitaxial growth; and
    a second region of the first conductivity-type for another of the emitter and collector, the second region being an impurity doped region and formed on the base region,
    wherein an impurity concentration of the base region formed by epitaxial growth is within one order of magnitude of the buried well and wherein an impurity concentration of said first region beneath said base region is higher than said impurity concentration of said base region.

* * * * *